United States Patent [19]

Matsuda

[11] Patent Number: 4,607,391
[45] Date of Patent: Aug. 19, 1986

[54] VHF/UHF BAND SWITCHING TUNER INCLUDING A SECOND DIODE IN BAND SWITCH LOOP

[75] Inventor: Shigetoshi Matsuda, Soma, Japan

[73] Assignee: Alps Electric Co., Ltd., Japan

[21] Appl. No.: 431,680

[22] Filed: Sep. 30, 1982

[30] Foreign Application Priority Data

Dec. 25, 1981 [JP] Japan .................... 56-197325[U]

[51] Int. Cl.⁴ ..................... H04B 1/16; H03J 5/24
[52] U.S. Cl. ........................... 455/188; 334/1; 334/47; 334/56
[58] Field of Search ............... 334/1, 15, 47, 56, 60; 455/188, 190, 191, 195, 180; 358/191.1

[56] References Cited

U.S. PATENT DOCUMENTS 4,189,678  2/1980  Sakamoto et al. .................. 455/180
4,291,290  9/1981  Ijichi et al. .......................... 334/1
4,326,295  4/1982  Matsumoto ...................... 455/188

Primary Examiner—Eugene R. LaRoche
Assistant Examiner—Benny T. Lee
Attorney, Agent, or Firm—Guy W. Shoup

[57] ABSTRACT

A band switching circuit for a tuner for receiving VHF and UHF channels comprises a tuning circuit including a switching diode having an anode and a cathode for band switching, a plurality of resistors connected to the anode and cathode of the switching diode to thereby form a series-connected circuit, and a second diode connected in the series-connected circuit in a direction opposite to that of the switching diode. The switching diode can be forward-biased or reverse-biased for receiving the VHF channels, and can be disconnected from a DC power supply for receiving the UHF channels.

3 Claims, 3 Drawing Figures

VHF/UHF BAND SWITCHING TUNER INCLUDING A SECOND DIODE IN BAND SWITCH LOOP

BACKGROUND OF THE INVENTION

The present invention relates to an improvement in a tuner adapted for use with a television receiver with a video tape recorder connected therewith.

Recently television receivers have frequently been connected with a video tape recorder for use as a display unit when the video tape recorder is operated for recording and playback, as well as for the reception of television broadcasts. The existing television receiver is connected to the video tape recorder through a signal switching unit normally built into the video tape recorder for electrical connection between the antenna, the television receiver and the video tape recorder. Such a signal switching unit is generally of the so-called "off-through" type for allowing either the television receiver or the video tape recorder to be used while the other is turned off. The conventional tuners have been disadvantageous in that when the television receiver is used with the video tape recorder de-energized, the tuner in the video tape recorder tends to produce disturbing signals which adversely affect normal signal reception by the television receiver when the video tape recorder tuner is supplied with television signals of higher levels.

SUMMARY OF THE INVENTION

Therefore, it is an object of the present invention to provide a band switching circuit for tuners which includes means for preventing a switching diode in a tuning circuit from generating disturbing signals.

According to the present invention, a band switching circuit for a tuner for receiving VHF and UHF channels comprises a tuning circuit including a switching diode having an anode and a cathode for band switching, a plurality of resistors connected to the anode and cathode of the switching diode to thereby form a series-connected circuit, and a second diode connected in the series-connected circuit in a direction opposite to that of the switching diode. The switching diode can be forward-biased or reverse-biased for receiving the VHF channels, and can be disconnected from a DC power supply for receiving the UHF channels.

The above and other objects, features and advantages of the present invention will become more apparent from the following description when taken in conjunction with the accompanying drawings in which a preferred embodiment of the present invention is shown by way of illustrative example.

DETAILED DESCRIPTION

Figure 1:
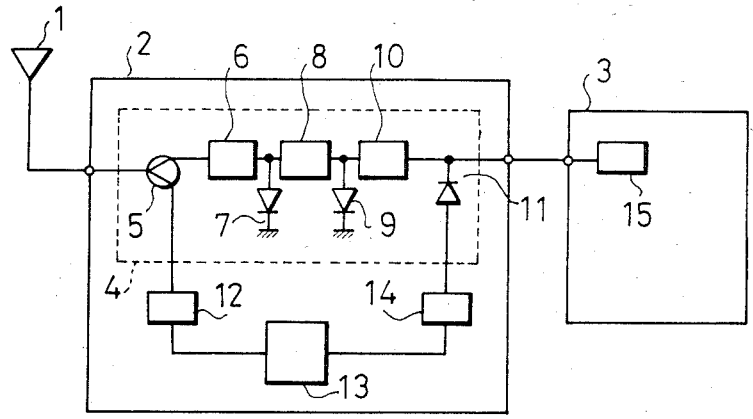
FIG. 1 is a block diagram showing a video tape recorder and a television receiver which are interconnected.

FIG. 1 shows a general arrangement in which a television receiver is coupled with a video tape recorder having an off-through type signal switching unit.

As shown in FIG. 1, an antenna 1 is connected to a video tape recorder 2 which is connected to a television receiver 3. The video tape recorder 2 includes a signal switching unit 4 having a distributor 5, high-pass filters 6, 8, 10, and switching diodes 7, 9, 11. The video tape recorder 2 and the television receiver 3 have tuners 12, 15, respectively. The video tape recorder 2 also includes a recording and playback circuit 13 and a modulator 14. The video tape recorder 2 and the television receiver 3 are selectively put in operation as desired by switching on or off the switching diodes 7, 9, 11 through control of a control unit (not shown). For example, when receiving a broadcast on the television receiver 3, the switching diodes 7, 9, 11 are turned off to allow television signals to be delivered from the antenna 1 through the distributor 5, the high-pass filters 6, 8, 10 to the tuner 15. For playing back recorded information, the switching diodes 7, 9 are turned on to attenuate signals from the distributor 5 and the switching diode 11 is also turned on to permit video signals to be supplied from the recording and playback circuit 13 via the modulator 14 to the tuner 15.

Figure 2:
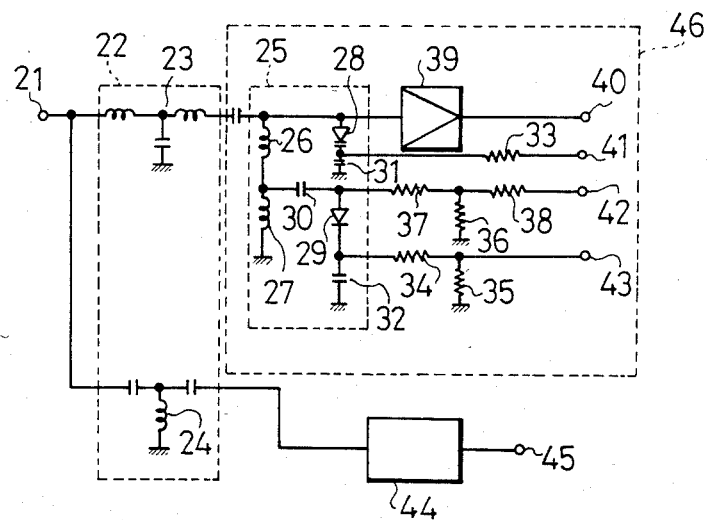
FIG. 2 is a circuit diagram, partly in block form, of a conventional tuner input unit.

A conventional input circuit for each of the tuners 12, 15 is shown in its principal portion in FIG. 2.

As shown in FIG. 2, a branching filter unit 22 serves to divide mixed VHF and UHF signals supplied to an input terminal 21 of the tuner into separate VHF and UHF signals, the branching filter unit 22 being composed of a low-pass filter 23 and a high-pass filter 24. A VHF tuner 46 includes an input tuning circuit 25 comprising coils 26, 27, a varactor diode 28, a switching diode 29 for switching between reception bands, and bypass capacitors 30, 31, 32. The VHF tuner 46 also has an RF amplifier 39 having an output terminal 40 connected through a functional circuit (not shown) in the VHF tuner 46 to a circuit in the television receiver, such as a video intermediate frequency amplifier. A UHF tuner 44 has an output terminal 45 connected to another functional circuit (not shown) in the VHF tuner 46. A tuning voltage is applied to the varactor 28 in the tuning circuit 25 via a terminal 41 which is connected to other varactor diodes in other tuning and local oscillator circuits in the VHF tuner 46 and the UHF tuner 44. Terminals 42, 43 serve to supply voltages for band switching to select lower VHF channels, higher VHF channels, and UHF channels. The band switching is effected by the voltages applied to the terminals 42, 43 in cooperation with the switching diode 29 and the resistors 34 through 37. The resistor 36 also acts to discharge the bypass capacitor 30. More specifically, when the band switching control changes from a mode for receiving higher VHF channels to a mode for receiving lower VHF channels, the switching diode 29 becomes reverse-biased or is rendered non-conductive. At this time, the voltage across the bypass capacitor 30 needs to be discharged immediately through the grounded end of the resistor 36.

Switching operation for reception bands is effected as follows: For receiving lower VHF channels, the terminal 42 is open or no voltage is applied thereto, and a voltage of 15 V, for example, is imposed on the terminal 43 to reverse-bias the switching diode 29 to turn the latter off, thereby allowing the coils 26, 27 to operate in series for enabling the tuning circuit 25 to have a circuit constant necessary for the reception of lower VHF channels. When higher VHF channels are to be received, the terminal 43 is open and a voltage of 15 V, for example, is applied to the terminal 42 to forward-bias the switching diode 29 to turn on the same. The coil 27 is now short-circuited in the sense of an AC by the switching diode 29, whereupon the tuning circuit 25 has a circuit constant needed for the reception of higher VHF channels. For the reception of UHF channels, the terminals 42, 43 are open and the power supplied to the RF amplifier 38 is cut off to de-energize the VHF tuner 46, and the power is supplied to the UHF tuner 44.

In the arrangement shown in FIG. 1, when the television receiver 3 is in use with the video tape recorder 2 de-energized, the television receiver 3 is adversely affected by disturbing signals generated from the video tape recorder 2 as de-energized. More specifically, when the video tape recorder 2 is turned off, no voltage whatsoever is applied to the tuner 12 in the video tape recorder 2, and the switching diode 29 is biased at 0 V or no voltage is imposed between the anode and cathode thereof in the closed circuit composed of the diode 29 and the resistors 34, 35, 36, 37. On the other hand, television signals are supplied through the distributor 5 to the tuner 12 in the video tape recorder 2 as de-energized and the tuner 15 in the television receiver 3 as energized. When the level of the supplied television signals is too high, a current flows in the loop from the resistor 34 to the resistors 35 to 36 to 37 through rectifying action of the switching diode 29, and hence the television signals of the high level flow through the switching diode 29. Since diodes are generally nonlinear, the diode 29 generates harmonics of the television signals when the latter flow through the diode 29. The harmonics are delivered through the distributor 5 and the high-pass filters 6, 8, 10 of the signal switching unit 4 to the tuner 15 in the television receiver 3. When a UHF channel is received by the television receiver 3 at this time, the harmonics as supplied become disturbing signals since the harmonics have a frequency band overlapping the UHF band, thus preventing UHF channels from being normally received.

Figure 3:
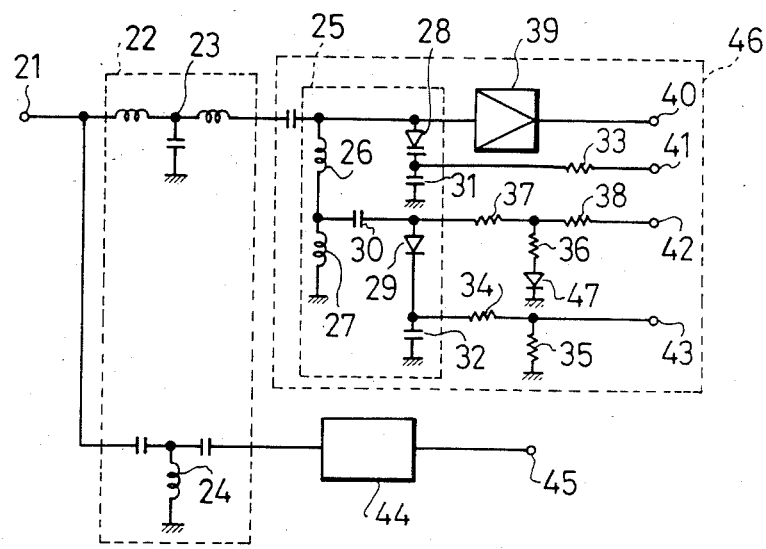
FIG. 3 is a circuit diagram, partly in block form, of a tuner input unit according to the present invention.

The present invention will be described with reference to FIG. 3. Identical parts in FIG. 3 are denoted by identical reference numerals in FIG. 2, and will not be described. As shown in FIG. 3, a diode 47 is inserted in the closed circuit composed of the switching diode 29 and the resistors 34 through 37 and is connected so that current flow therethrough is in a direction opposite to the direction of current flowing through the switching diode 29. The diode 47 is connected in series with the resistor 36 coupled between the voltage supply terminal 42 connected to the anode of the switching diode 29 and ground. The terminals 42, 43 for supplying voltages for band switching will operate in the same manner as that described with reference to FIGS. 1 and 2. More specifically, when lower VHF channels are to be received, the terminal 42 is open and 15 V is applied to the terminal 43 to turn off the switching diode 29 for thereby allowing the coils 26, 27 to act in series with each other, whereupon the tuning circuit 25 has a circuit constant necessary for the reception of lower VHF channels. For receiving higher VHF channels, the terminal 43 is open and 15 V is imposed on the terminal 42 to forward-bias the switching diode 29. The coil 27 short-circuited in the sense of an AC by the switching diode 29, thus enabling the tuning circuit 25 to have a circuit constant needed for receiving higher VHF channels. To receive UHF channels, the terminals 42, 43 are rendered open and the power supplied to the RF amplifier 39 is cut off to de-energize the VHF tuner 46, and the UHF tuner 44 is energized.

Since the diode 47 is connected in the direction opposite to that of the switching diode 29 within the closed circuit of the switching diode 29, the diode 47 and the resistors 34 through 37, the switching diode 29 is incapable of rectifying action in the closed circuit when television signals of a high level are supplied with the terminals 42, 43 open. Therefore, the high-level television signals do not flow through the switching diode 29, and it does not produce harmonics that would otherwise disturb normal reception of UHF channels. Where the present invention is incorporated in conventional tuners in which the switching diode 29 is biased at 0 V upon reception of UHF channels, the switching diode 29 does not produce harmonics while UHF channels are being received and while the power supply to the video tape recorder is cut off. Accordingly, the UHF tuner 44 and other tuners as connected will not be disturbed by such harmonics.

There are known those tuners (not shown) in which the switching diode 29 is forcibly reverse-biased during reception of UHF channels to prevent generation of harmonics. However, when two such tuners are connected as shown in FIG. 1 and one of them is de-energized, the switching diode in the de-energized tuner is biased at 0 V producing disturbing signals that adversely affect the other tuner. The present invention is also effective for such tuners in preventing disturbing signals from being supplied to other connected tuners. The invention is particularly of practical advantage when incorporated in an application in which a video tape recorder and a television receiver are interconnected.

The diode 47 is connected in series with the resistor 36 with the cathode thereof grounded. This arrangement does not adversely affect the turn-on or turn-off operation of the switching diode 29 for band switching.

Although a certain preferred embodiment has been shown and described, it should be understood that many changes and modifications may be made therein without departing from the scope of the appended claims.

What is claimed is:
1. A band switching circuit incorporated in an input circuit for a tuner for receiving VHF signals and UHF signals on a plurality of bands, comprising:
    (a) means forming a part of said band switching circuit including a VHF tuning circuit for receiving the VHF signals and including a switching diode having an anode and a cathode for switching between a band containing a higher VHF signal and a band containing a lower VHF signal;
    (b) means including a plurality of resistors connected respectively to said anode and cathode of said switching diode to thereby form a series-connected circuit capable of sustaining current flow, said circuit having a control terminal to which band switching voltages can be applied; and
    (c) a second diode connected between the anode side of said switching diode and ground in said series-connected circuit in a direction opposite to said switching diode for blocking any current flowing in said circuit and through said switching diode when said terminal is rendered in a condition to turn off said switching diode.

2. A band switching circuit according to claim 1, wherein said switching diode can be forward-biased or reverse-biased for receiving the VHF signals, and the VHF tuning circuit can be disconnected from a DC power supply for receiving the UHF signals.

3. The band switching circuit of claim 1 used with a television receiver connected with a video tape recorder.

* * * * *